(12) United States Patent
Flanagan (10) Patent No.: US 9,739,816 B2
(45) Date of Patent: Aug. 22, 2017

(54) CAPACITIVE SENSOR WITH DIFFERENTIAL SHIELD

(71) Applicant: ANALOG DEVICES, INC., Norwood, MA (US)

(72) Inventor: Adrian Anthony Flanagan, Mountain View, CA (US)

(73) Assignee: ANALOG DEVICES, INC., Norwood, MA (US)

( * ) Notice: Subject to any disclaimer, the term of this patent is extended or adjusted under 35 U.S.C. 154(b) by 299 days.

(21) Appl. No.: 14/526,872

(22) Filed: Oct. 29, 2014

(65) Prior Publication Data

US 2015/0145537 A1    May 28, 2015

Related U.S. Application Data (60) Provisional application No. 61/909,728, filed on Nov. 27, 2013.

(51) Int. Cl.
*G01R 27/26* (2006.01)
*H03K 17/96* (2006.01)

(52) U.S. Cl.
CPC ..... *G01R 27/2605* (2013.01); *H03K 17/9622* (2013.01); *H03K 2217/960705* (2013.01); *H03K 2217/960745* (2013.01); *H03K 2217/960765* (2013.01)

(58) Field of Classification Search
CPC ....... G01R 27/2605; G06K 9/002; G01D 5/24
USPC .......................................................... 324/686
See application file for complete search history.

(56) References Cited

U.S. PATENT DOCUMENTS

| | | | | |
|---|---|---|---|---|
| 5,602,486 A | * | 2/1997 | Novak | G01B 7/087 324/519 |
| 5,726,579 A | * | 3/1998 | Masuda | G01R 27/2605 324/658 |
| 6,486,680 B1 | * | 11/2002 | Mull | B65H 7/04 324/658 |

(Continued)

FOREIGN PATENT DOCUMENTS

| | | |
|---|---|---|
| CN | 1910819 | 2/2007 |
| CN | 101458099 | 6/2009 |

(Continued)

OTHER PUBLICATIONS

Notice of Allowance issued in KR Patent Application Serial No. 10-2014-0164472 mailed Apr. 29, 2016, 2 pages.

(Continued)

*Primary Examiner* — Tung X Nguyen
*Assistant Examiner* — Dominic Hawkins
(74) *Attorney, Agent, or Firm* — Patent Capital Group (57) ABSTRACT

The present disclosure describes a differential shield capacitive sensor design. The sensor design uses a differential measurement to measure capacitance and a pair of traces are used to differentially reject the response of the sensor traces and balance any parasitic capacitances. In some embodiments, the sensor design includes a differential sensor design on a bottom side of a flex circuit to differentially balance the environment and reject noise coupling to the sensor. The top side of the flex circuit can include a single ended design for proper environment sensing. The spatial arrangement and size of the sensors may vary depending on the application.

20 Claims, 5 Drawing Sheets

(56) References Cited

U.S. PATENT DOCUMENTS

| | | | |
|---|---|---|---|
| 6,731,121 B1* | 5/2004 | Hsu | G01D 5/24 324/678 |
| 6,949,937 B2* | 9/2005 | Knoedgen | G01D 5/241 324/658 |
| 6,970,126 B1 | 11/2005 | O'Dowd et al. | |
| 7,235,983 B2 | 6/2007 | O'Dowd et al. | |
| 8,050,876 B2 | 11/2011 | Feen et al. | |
| 2005/0002149 A1* | 1/2005 | Nakatani | H01L 23/5223 361/328 |
| 2005/0179415 A1* | 8/2005 | Nakano | H03K 17/955 318/478 |
| 2006/0243462 A1 | 11/2006 | Schilling et al. | |
| 2009/0128374 A1* | 5/2009 | Reynolds | G06F 3/0202 341/33 |
| 2009/0273570 A1 | 11/2009 | Denger et al. | |
| 2010/0052700 A1 | 3/2010 | Yano et al. | |
| 2011/0063247 A1* | 3/2011 | Min | G06F 3/044 345/174 |
| 2011/0254565 A1* | 10/2011 | De Boer | G01B 7/023 324/601 |
| 2012/0217982 A1 | 8/2012 | Narayanasamy et al. | |
| 2012/0274340 A1* | 11/2012 | Yang | G01R 17/02 324/680 |
| 2012/0306802 A1* | 12/2012 | McCracken | G06F 3/0416 345/174 |
| 2013/0090873 A1* | 4/2013 | Lundstrum | H03K 17/962 702/64 |
| 2013/0120310 A1* | 5/2013 | Siska | H03K 17/962 345/174 |
| 2014/0015796 A1* | 1/2014 | Philipp | G06F 3/03547 345/174 |
| 2014/0139239 A1* | 5/2014 | Zachut et al. | G06F 3/044 324/658 |
| 2014/0226083 A1* | 8/2014 | Dunphy et al. | G06F 3/044 349/12 |
| 2015/0145537 A1* | 5/2015 | Flanagan | G01R 27/2605 324/686 |

FOREIGN PATENT DOCUMENTS

| | | |
|---|---|---|
| CN | 101666832 | 3/2010 |
| CN | 102016775 | 4/2011 |
| CN | 102843122 | 12/2012 |
| JP | 2010-61405 | 3/2010 |
| JP | 2011179822 | 9/2011 |
| KR | 1020060119122 | 9/2008 |
| KR | 1020150087623 | 2/2016 |
| TW | 201307804 | 2/2013 |

OTHER PUBLICATIONS

English Translation of Allowed Claims issued in KR Patent Application Serial No. 10-2014-0164472 mailed Apr. 29, 2016, 4 pages.
Office Action issued in CN Patent Application Serial No. 201410690931.9 mailed Jul. 29, 2016, 6 pages.
Kevin Staunton, "AC Shield Enhances Remote Capacitive Sensing", CapTouch: Analog Dialogue: Analog Devices, http://www.analog.com/library/analogdialogue/archives/42-05/ad7147_captouch.html, Nov. 27, 2013, 2 pages.
AD7146, "CapTouch Programmable Controller for Single-Electrode Capacitance Sensors", © 2012-2013 Analog Devices, Inc., www.analog.com, 72 pages.
AN529, "Capacitive Sensing Through Long Wires", Rev 0.2 Jul. 2013, © 2013 by Silicon Laboratories, 4 pages.
L. K. Baxter, "Capacitive Sensors", © Jun. 26, 2000, revised Jul. 20, 2000, 17 pages.
QTAN0087, "Proximity Design Guide", Atmel, 10760B-AT42—Mar. 2012, © 2011-2012, Amtel Corporation, 18 pages.
SX9300, "Ultra Low Power, Dual Channel Smart Proximity SAR Compliant Solution—Wireless & Sensing", Semtech, Revision 4, Feb. 5, 2014, © 2014 Semtech Corporation, www.semtech.com, 39 pages.
SX9500, "Ultra Low Power, Four Channels Capacitive Proximity/Button Solution—Wireless & Sensing", Semtech International AG, Revision 4, Feb. 4, 2014, © 2014 Semtech Corporation, www.semtech.com, 36 pages.
Notice of Preliminary Rejection issued in KR Patent Application Serial No. 10-2014-0164472 mailed Nov. 18, 2015, 3 pages.
English Summary of Notice of Preliminary Rejection issued in KR Patent Application Serial No. 10-2014-0164472 mailed Nov. 18, 2015, 2 pages.

* cited by examiner

CAPACITIVE SENSOR WITH DIFFERENTIAL SHIELD

CROSS-REFERENCE TO RELATED APPLICATIONS

This Non-provisional Patent Application claims benefit of a prior-filed U.S. Provisional Application No. 61/909,728, filed on Nov. 27, 2013, entitled "DIFFERENTIAL SHIELD SENSOR DESIGN", which is hereby incorporated by reference in its entirety.

TECHNICAL FIELD OF THE DISCLOSURE

The present disclosure relates generally to sensors and, more particularly, to design and sampling of capacitive sensors.

BACKGROUND

Capacitive sensing is a technology based on capacitive coupling, a capacitive sensor can detect characteristics of materials nearby a capacitive sensor. The materials may either be conductive and/or have a different dielectric than its surroundings. Capacitive sensing is used in many different types of sensors, including those to detect and measure proximity, position or displacement, humidity, fluid level, and acceleration. Capacitive sensing has become more popular as capacitive sensors for detecting changes in capacitance become more accurate and reliable. For instance, capacitive sensors are used in many devices such as laptop trackpads, digital audio players, computer displays, mobile phones, mobile devices, tablets, etc. Design engineers continue to choose capacitive sensors for their versatility, reliability and robustness, and cost reduction over mechanical switches.

Capacitive sensors typically work by providing an electrode on a single- or multiple-layer printed circuit board (PCB)), flex circuit, and/or printed conductor, where the electrode is stimulated to generate an electric field. The sensor electrode on the PCB forms as one plate of a virtual capacitor. The other plate of the virtual capacitor is provided by an external object, such as a user's finger, or some kind of conductive material, etc. The sensor electrode can measure changes to the capacitance over the virtual capacitor over the sensor electrode as the external object disturbs the electric field generated by the sensor electrode. Using the capacitive measurements, disturbances caused by the external object can be accurately detected.

Overview

The present disclosure describes a differential shield capacitive sensor design. The sensor design uses a differential measurement to measure capacitance and a pair of traces are used to differentially reject the response of the sensor traces and balance any parasitic capacitances. In some embodiments, the sensor design includes a differential sensor design on a bottom side of a flex circuit to differentially balance the environment and reject noise coupling to the sensor. The top side of the flex circuit can include a single ended design for proper environment sensing. The spatial arrangement and size of the sensors may vary depending on the application.

BRIEF DESCRIPTION OF THE DRAWING

To provide a more complete understanding of the present disclosure and features and advantages thereof, reference is made to the following description, taken in conjunction with the accompanying figures, wherein like reference numerals represent like parts, in which.

DESCRIPTION OF EXAMPLE EMBODIMENTS OF THE DISCLOSURE

Some Issues Associated with Some Capacitive Sensors

Capacitive sensing based user interfaces are desirable features for the latest consumer electronic products. From cell phones to media players to satellite navigation systems, the trend to enhance the human interface is evolving. The principle of a user's touch causing a change in capacitance to activate a switch is well understood, but implementing a PCB sensor design with proper shielding and routing poses a challenge for hardware designers.

In many cases, capacitive sensing is used in an environment that is prone to noise from various noise sources, or the physical design of the electrodes and traces are prone to noise within the system. The change in capacitance in response to a finger touch is only a fraction of a picofarad, so tiny parasitic capacitances seen by the sensor or sensor traces reduce the dynamic range of the capacitive sensor controller. In addition, inadequate sensor shielding can present coupling paths that create a noisy response, degrading the signal-to-noise ratio (SNR) achievable by the sensor and decreasing the resolution of the user interface.

To address the noise issue, some solutions provide an active/driven (alternating current) AC Shield signal that alleviates the problem of parasitic capacitance, remote sensor connection, sensor routing and shielding of the capacitive sensors. The advantage of the driven AC Shield signal is that the sensors and the sensor traces can be shielded by a signal that is in phase with the excitation on the sensors. Eliminating the potential between shield and sensor/sensor traces also eliminates the capacitance. Therefore, to minimize parasitic capacitance and noise coupling, the driven AC Shield signal can be flooded on the sensor board and used as a guard signal along all sensor traces. Some other solutions provide a (virtual) grounded shield to reject noise sources on the back of the sensor. In yet some other solutions targeted to address interference susceptibility of antenna-like traces and unwanted capacitance of the traces themselves, a grounded shield may be provided to shield long sensing traces (similar to a coaxial cable), or use a second capacitive sensing line to eliminate effects of interference through a common mode measurement system.

Solutions using grounded shields and/or driven AC shields can often cause a reduction in sensitivity. Grounded shield designs 'steal' a substantial amount of charge from the sensor and sensor traces. AC shields are much better at reducing this effect, but it is common that the AC drive waveform is slewed due to the extra parasitic capacitances it is loaded with as a shield compared with the sensor itself, and is therefore non-ideal.

An Improved Approach: Differential Measurement and Differential Shield Design

An improved capacitive sensor design or assembly can alleviate at least some of the issues described herein. According to one aspect, the improved capacitive sensor design uses a differential measuring system to measure a sensor that has a differential shield. Specifically, the differential measuring system is configured to excite or charge respective parts of the improved sensor differentially, and to sample the respective parts of the sensor at the same time (not sequentially) to obtain a differential capacitive sensor measurement (two differential signals). The differential measurement can be provided as inputs to a differential integrator which can generate a measurement which is independent from a common mode signal present in the differential measurement. Differential measuring with the improved sensor having a differential shield connected to a pair of traces can differentially reject the response of the sensor traces and balance the parasitic capacitances. The pair of traces are referred herein as the "P trace" and the "N trace". Using a differential approach, noise interferences would be present on both complementary signals measured at the ends of the traces, but the interferences appearing as a common mode signal would be cancelled out due to differential signaling.

One important feature of the improved design is that not only the differential shield is driven by a differential signal, the differential shield is also differentially measured and used as part of the capacitive measurement. To provide a differential signal and to measure differentially, different parts of the capacitive sensor are electrically connected to respective traces, referred herein as the "P trace" and the "N trace". The ends of the traces are then connected to corresponding P and N terminals of circuitry configured to make a differential capacitive sensor measurement. During the charging phase, the ends of the traces (and the respective parts of the sensor) are excited or charged by a first one of the complementary/differential signal and a second one of the complementary/differential signal respectively. The complementary/differential signals are referred to herein as the "P signal" and the "N signal". During the sampling phase, the ends of the traces can be connected to the circuitry for making a first one of the complementary/differential measurement and a second one of the complementary/differential measurement respectively. The complementary/differential signals are referred to herein as the "P measurement" and the "N measurement". The P measurement and the N measurement are made at the same time. The ultimate measurement is usually represented by the difference between the P measurement and the N measurement to reject the common mode signal.

The improved capacitive sensor can sense an environment of the capacitive sensor using differential sampling. Specifically, the capacitive sensor can include a single-ended portion, a segmented differential shield portion having multiple segments, and a pair of traces. Generally speaking, these parts are conductive, or made of a suitable material to act as electrodes of a capacitive sensor. The single-ended portion is connected to one of the traces, and segments of the segmented differential shield portion are connected to either one of the pair of traces.

Within the context of the disclosure, the environment generally means the surroundings of the sensor, or the area of space nearby the sensor. The environment can include one or more objects, such as materials or parts of a living being, etc. The capacitive sensor and circuitry connected thereto can enable a differential signal (two differential signals) representative of the environment to be obtained. The differential signal representative of the environment (or a single-ended derivation thereof) can provide an indication of the varying dielectric constant of the environment, changes in the amount of charge on the capacitive sensor, and/or distance of one or more objects to the capacitive sensor, etc.

The improved capacitive sensor design includes a single ended portion on one side (referred to herein as the top side) of an (electrically) insulating layer to allow the sensor to sense the environment (e.g., a user approaching the sensor, an object near the sensor, etc.). Furthermore, the improved capacitive sensor design includes a segmented differential shield portion on the other side (referred to herein as the bottom side) of the (electrically) insulating layer to differentially balance the environment surrounding the sensor and to help reject any noise coupling to the segmented differential shield portion. For instance, the single-ended portion is on a first side of an insulating layer, and the segmented differential shield portion is on a second side of the insulating layer. In some cases, the single-ended portion is on a first side of an insulating layer, and the segmented differential shield portion is on both the first side and a second side of the insulating layer. Examples of the insulating layer include: a circuit board, flexible plastic substrate of a flexible circuit, and/or electrically insulating material.

Different segments of the segmented differential shield portion are connected to respective P and N traces, thus providing one or more "P segments" or "N segments". One aspect of the differential shield portion on the bottom side is that the area or charge contribution of the P segment(s) can be equal to or balanced with the area or charge contribution of the N segment(s). Phrased differently, the P segment(s) of the segmented differential shield portion connected to a first one of the traces (the P trace) has the same area or charge contribution as the N segment(s) of the segmented differential shield portion connected to a second one of the traces (the N trace). This aspect helps to reject noise sources from underneath the capacitive sensor and also alleviates issues of noise on the signal traces between the sensor and the processor (or processing circuit) of the capacitive sensing system.

This improved capacitive sensor design may be suitable for systems where capacitive sensor(s) are provided to sense a user or an object in proximity to the sensor(s) and when the user comes into contact with the sensor(s). Moreover, the design may be particularly suitable for systems where noise due to other electronics underneath the sensor may be present. For instance, capacitive sensors at or near the surface of a handheld device or device with which a user can interact can be susceptible to interference from the electronics inside the handheld device due to temperature changes caused by the variable heat of the electronics.

Effectively, the differential shield design allows noise and parasitics to couple into the measurement, but because the noise and parasitics couple equally into both the positive and negative side of the differential measurement, these noise and parasitics are rejected. Furthermore, the differential shield design can limit the amount of charge that is 'stolen'.

Geometric and Arrangement-Related Design Considerations

The improved capacitive sensor is unique in its geometry and arrangement. Broadly speaking, the single-ended portion is adapted to sense the environment, and the segmented differential shield portion is adapted to differentially balance the environment and reject noise coupling to segmented differential shield portion. Accordingly, the design of the capacitive sensor is non-trivial. Though, no matter the geometry, the single-ended portion and the segments of the segmented differential shield portion are driven by either one of two differential signals (the P signal and the N signal) during a charging phase. Furthermore, the pair of traces are connected to processing circuitry, e.g., via two terminals respectively, for differential sampling during the sampling phase.

The single-ended portion is preferably smaller than the segmented differential shield portion, and the segmented differential shield is generally placed between the expected noise source and the single-ended portion to provide a shielding effect. Phrased differently, the segmented differential shield portion is preferably larger, i.e., spans a larger area, than the single ended portion. This feature can allow the segmented differential shield portion to provide a larger shielding effect surrounding the sensor, making the single-ended portion more immune to undesirable noise sources (as opposed to smaller segmented differential shield portions). The ratio of the sizes of the single-ended portion and the segmented differential shield portion may vary depending on the application.

In some designs, the single-ended portion is centered with respect to the segmented differential shield portion. In some other designs, the single-ended portion may not be centered, but skewed in a particular direction with respect to the segmented differential shield portion. These designs can be useful if the noise coupling to the segmented differential shield portion is directional, and the skewed position can better shield the capacitive sensor from the directional noise.

As illustrated by the some examples in the following sections, the single ended portion preferably has a circular shape, but other shapes are also envisioned (e.g., squares, ovals, triangles, rectangles, pentagons, hexagon, octagons, other suitable polygons, etc.). The segmented differential shield portion may also span different shapes depending on the application, e.g., circular shapes, squares, ovals, triangles, rectangles, pentagons, hexagon, octagons, other suitable polygons, etc. The shape of the single-ended portion and the shape of the segmented differential shield portion may be the same or different.

While the segment(s) of the segmented differential shield portion connected to a first one of the traces has the same area or charge contribution as the segment(s) of the segmented differential shield portion connected to a second one of the traces, the geometry of the single-ended portion and the geometry of the segmented differential shield portion may or may not be symmetric. For the single-ended portion, symmetry can be advantageous, e.g., if the object in the environment being sensed is expected to arrive at the sensor from any one direction. Asymmetry can be advantageous, e.g., for sensing a specially designed area which may not be symmetric, and/or if the object in the environment being sensed is expected to arrive from a particular direction. For the segmented differential shield portion, symmetry can be advantageous for balancing an environment where noise is expected to arrive from any one direction. Conversely, asymmetry can be advantageous for balancing an environment where noise is expected to arrive from a specific direction.

The number of segments in the segmented differential shield portion may vary depending on the application and manufacturability. The shape and size of the segments of the differential shield portion may also vary depending on the application and manufacturability. Generally speaking, the segment(s) of the segmented differential shield portion connected to a first one of the traces are arranged in an alternating fashion with the segment(s) of the segmented differential shield portion connected to a second one of the traces.

Exemplary Circular Design

Figure 1A:
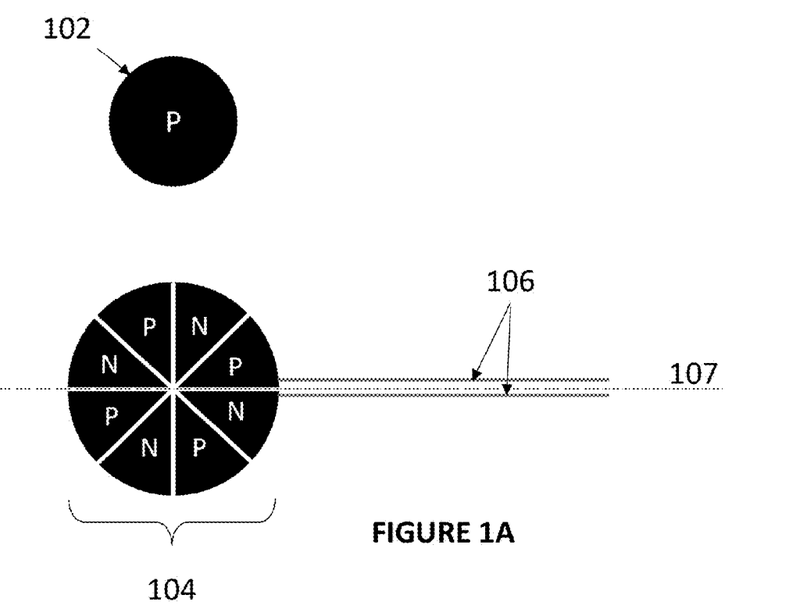
FIG. 1A shows a top view of an exemplary differential sensor design, according to some embodiments of the disclosure.

FIG. 1A shows a top view of an exemplary capacitive sensor design having a differential shield portion, according to some embodiments of the disclosure. The design as shown is partially disassembled to better illustrate the design, where the single-ended portion and the segmented differential shield portion are shown side by side and not one on top of another. The differential capacitive sensor design comprises a single-ended portion 102, a segmented differential shield portion 104, and a pair of signal traces 106. The pair of signal traces 106 can carry the P signal and the N signal respectively for differential signaling, i.e., charging of the respective parts of the capacitive sensor using a respective one of two differential signals (the P signal and the N signal). Furthermore, the pair of traces can be connected to differential sampling circuitry.

In this example, the single-ended portion 102 has a circular shape, and is connected to the signal trace for carrying the P signal. In another embodiment, the single-ended portion may be connected to the signal trace for carrying the N signal. Furthermore, the segmented differential shield portion 104 has a circular shape. The segmented differential shield portion has 8 segments (each segment have a "pizza slice" or wedge like shape). The 8 segments comprise (1) 4 segments connected to the signal trace for carrying the P signal ("P segments", indicated with a "P" in the figure), and (2) 4 segments connected to the signal trace for carrying the N signal ("N segments", indicated with an "N" in the figure). Phrased differently, the P segments and the N segments are charged with opposite polarity during the charging phase. Via the respective traces, disturbances on the charge on the single-ended portion 102, the P segments, and the N segments enable a differential signal pair (two differential signals) representative of the environment of the capacitive sensor to be measured or obtained (by appropriate circuitry for sampling the capacitive sensor differentially).

While this example shows 8 segments, other numbers of segments are also envisioned. For instance, the segmented differential shield portion 104 may have 10 total segments (5 P segments and 5 N segments), or 6 total segments with (3 P segments and 3 N segments). The number of P segments does not have to equal the number of N segments, but the area taken up by the P segments and the N segments should substantially be the same for a proper balancing effect. The P segments and N segments may have equal sizes. In some embodiments, the P segments and N segments are equal in size individually). The segmentation of the segmented differential shield portion 104 can have a symmetric quality to provide a balancing effect (spatially/geometrically).

The single-ended portion 102 is preferably smaller than the segmented differential shield portion 104 such that the segmented differential shield portion 104 can provide adequate "shielding" of the single-ended portion 104 (the sensing portion for detecting an object or user nearby). The ratio of sizes of the single-ended portion 102 and the segmented differential shield portion 104 may vary depending on the application.

The signal traces 106 preferably run along each other (e.g., with equal distance) to avoid any antenna effect or parasitic capacitances. Along with the single-ended portion 102 and the segmented differential shield portion 104, the layout design of the signal traces 106 is preferably balanced/equal/symmetrical for optimal results, such that noise coupled to the signal traces 106 can be rejected by differential signaling.

Figure 1B:
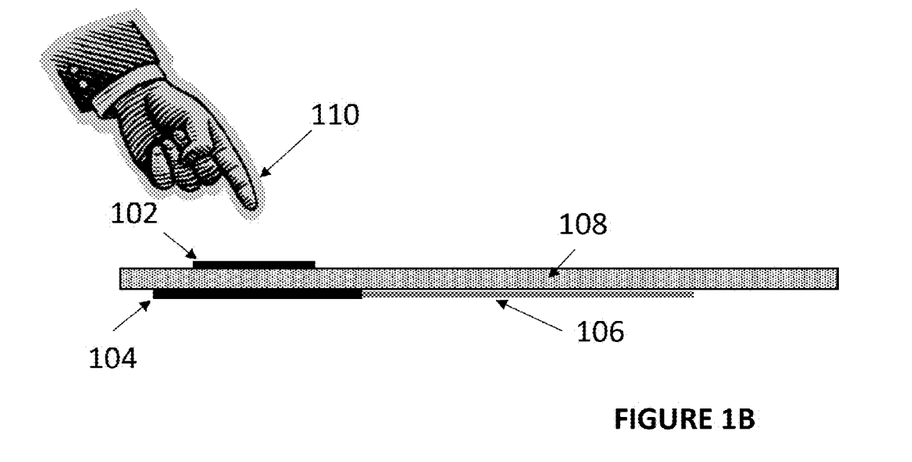
FIG. 1B shows a side view of an exemplary differential sensor design, according to some embodiments of the disclosure.

FIG. 1B shows a side view of an exemplary differential sensor design, according to some embodiments of the disclosure. The side view (or cross sectional view taken at line 107 in FIG. 1A) in FIG. 1B illustrates that the single-ended portion 102 is provided on a first side (top side) of an insulating material/layer 108 and the segmented differential shield portion 104 is provided on a second side (bottom side) of the insulating material/layer 108. The top side is preferably the side where a user or an object 110 is expected to approach the differential capacitive sensor assembly. The insulating material/layer 108 may be part of a (rigid) circuit board or a flexible circuit. The arrangement of the segmented differential shield portion on the bottom side provides a "shield" to the single-ended portion, where the single-ended portion is preferably the portion for sensing the environment.

Exemplary Hexagonal Design

Figure 2:
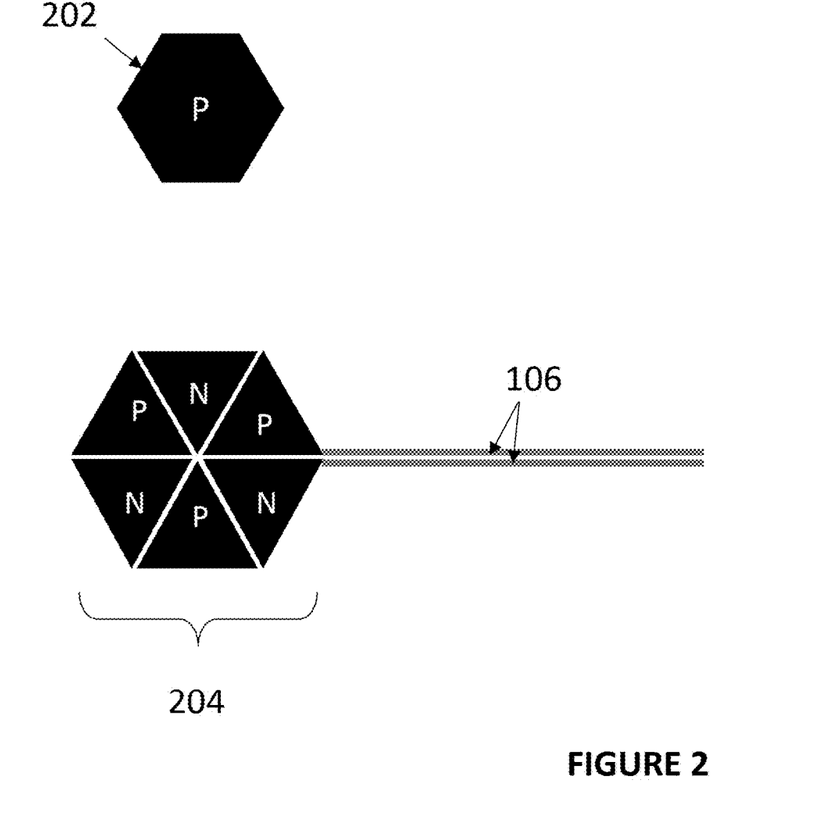
FIG. 2 shows a top view of another exemplary differential sensor design, according to some embodiments of the disclosure.

FIG. 2 shows a top view of another exemplary differential sensor design. In this alternate design, the single-ended portion 202 may have a hexagonal shape (although a circular shape may also be used). The single-ended portion 202 is denoted as arranged to provide a part of the "P" signal, the single-ended portion 202 could be used to provide a part of the "N" signal instead. The segmented differential shield portion 204 may have a hexagonal shape as well, with 6 triangular segments. The P segments are arranged in an alternating fashion with the N segments.

The signal traces 106 seen in FIG. 2 are similar or same as signal traces 106 described in relation to FIG. 1. Specifically, the pair of signal traces 106 can carry the P signal and the N signal respectively for differential signaling, i.e., charging of the respective P parts and N parts of the capacitive sensor using a respective one of two differential signals (the P signal and the N signal). Furthermore, the pair of signal traces 106 can be connected to differential sampling circuitry. The addition of the first segmented differential shield portion (the P and N segments surrounding the P segment in the center) provides additional differential shielding effect. This design can allow noise coupled to the first segmented differential shield portion and the second segmented differential shield portion to be rejected by differential signaling.

Exemplary Square Design

Figure 3:
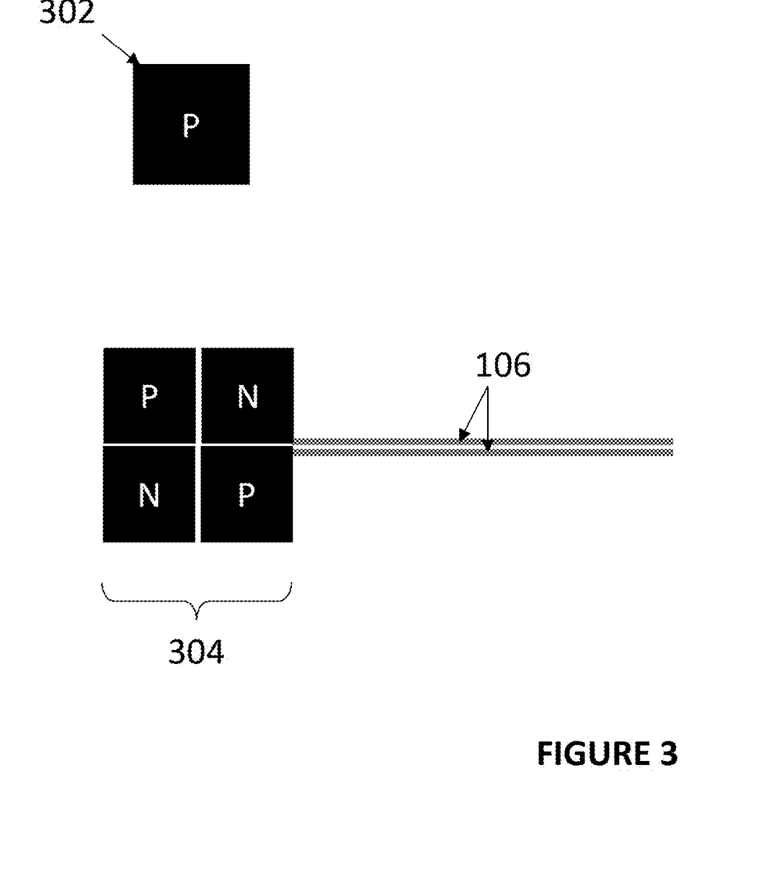
FIG. 3 shows a top view of yet another exemplary differential sensor design, according to some embodiments of the disclosure.

FIG. 3 shows a top view of yet another exemplary differential sensor design. In this alternate design, the single-ended portion 302 may have a square/rectangular shape (although a circular shape may also be used). The single-ended portion 302 is denoted as arranged to provide a part of the "P" signal, the single-ended portion 302 could be used to provide a part of the "N" signal instead. The segmented differential shield portion 304 may have a square/rectangular shape as well, with 4 square/rectangular segments. The P segments are arranged in an alternating fashion with the N segments.

The signal traces 106 seen in FIG. 3 are similar or same as signal traces 106 described in relation to FIG. 1. Specifically, the pair of signal traces 106 can carry the P signal and the N signal respectively for differential signaling, i.e., charging of the respective P parts and N parts of the capacitive sensor using a respective one of two differential signals (the P signal and the N signal). Furthermore, the pair of signal traces 106 can be connected to differential sampling circuitry. The addition of the first segmented differential shield portion (the P and N segments surrounding the P segment in the center) provides additional differential shielding effect. This design can allow noise coupled to the first segmented differential shield portion and the second segmented differential shield portion to be rejected by differential signaling.

Exemplary Extended Differential Shield Design

Figure 4A:
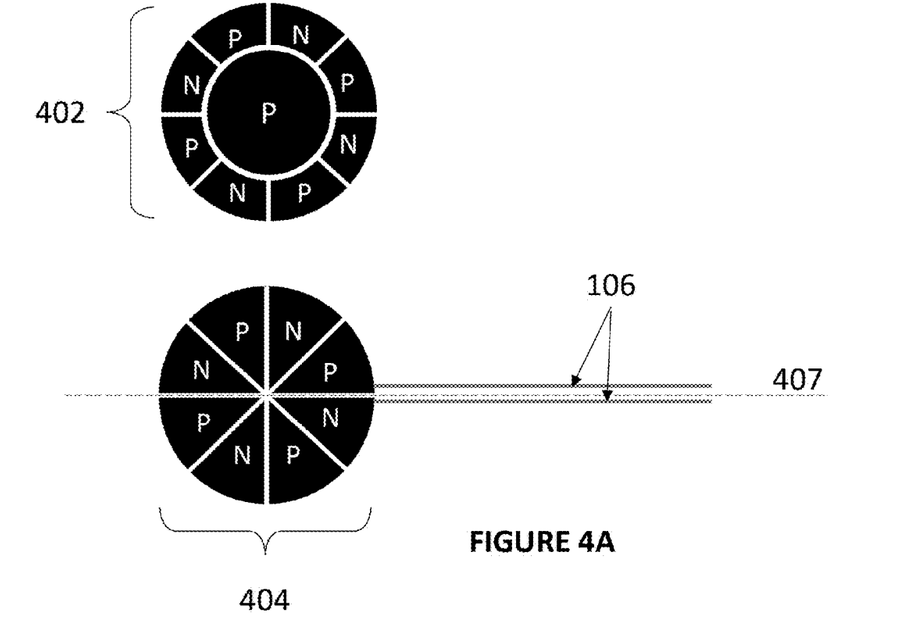
FIG. 4A shows a top view of an exemplary differential sensor design, according to some embodiments of the disclosure.

FIG. 4A shows a top view of an exemplary differential sensor design, according to some embodiments of the disclosure. The design as shown is partially disassembled to better illustrate the design, where two portions of a capacitive sensor are shown side by side and not one on top of another. The differential capacitive sensor design comprises a top portion 402 that includes a single-ended portion (denoted by the P segment in the center) and a first segmented differential shield portion (shown as P and N segments surrounding the P segment in the center). In this example, the first segmented differential shield portion surrounds the single-ended portion. If desired, the first segmented differential shield portion does not surround the single-ended portion completely (e.g., only adjacent to a fraction of the single-ended portion's perimeter, on only one side of the single-ended portion, etc.). The design further includes a bottom portion 104 (shown as P and N wedges) comprising a second segmented differential shield portion and a pair of signal traces 106. The characteristics of the bottom portion 404 is similar to the segmented differential shield portion 104 of FIG. 1.

The signal traces 106 seen in FIG. 4 are similar or same as signal traces 106 described in relation to FIG. 1. Specifically, the pair of signal traces 106 can carry the P signal and the N signal respectively for differential signaling, i.e., charging of the respective P parts and N parts of the capacitive sensor using a respective one of two differential signals (the P signal and the N signal). Furthermore, the pair of signal traces 106 can be connected to differential sampling circuitry. The addition of the first segmented differential shield portion (the P and N segments surrounding the P segment in the center) provides additional differential shielding effect. This design can allow noise coupled to the first segmented differential shield portion and the second segmented differential shield portion to be rejected by differential signaling.

Figure 4B:
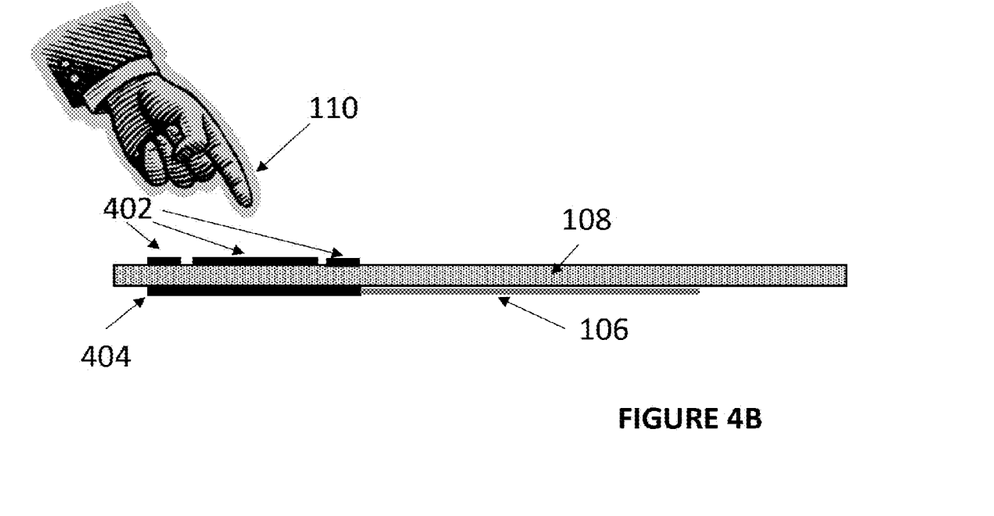
FIG. 4B shows a side view of an exemplary differential sensor design, according to some embodiments of the disclosure.

FIG. 4B shows a side view of an exemplary differential sensor design, according to some embodiments of the disclosure. The side view (or cross sectional view taken at line 407 in FIG. 4A) in FIG. 4B illustrates that the top portion 402 (having both the single-ended portion and the first segmented differential shield portion) is provided on a first side (top side) of an insulating material/layer 408 and the bottom portion 404 is provided on a second side (bottom side) of the insulating material/layer 408. The top side is preferably the side where a user or an object 110 is expected to approach the differential capacitive sensor assembly. The insulating material/layer 108 may be part of a (rigid) circuit board or a flexible circuit. The arrangement of the segmented differential shield portion on the bottom side provides a "shield" to the single-ended portion, where the single-ended portion is preferably the portion for sensing the environment.

Although not shown, it is envisioned that some designs may provide just the top portion on the first side of the insulating layer having both the single-ended portion and the first segmented differential shield portion (no second segmented differential shield portion on the second side of the insulating layer). The first segmented differential shield portion can serve to provide a shielding effect for the single-ended portion, potentially against noise that could couple to the first segmented differential shield portion.

A System Overview

Figure 5:
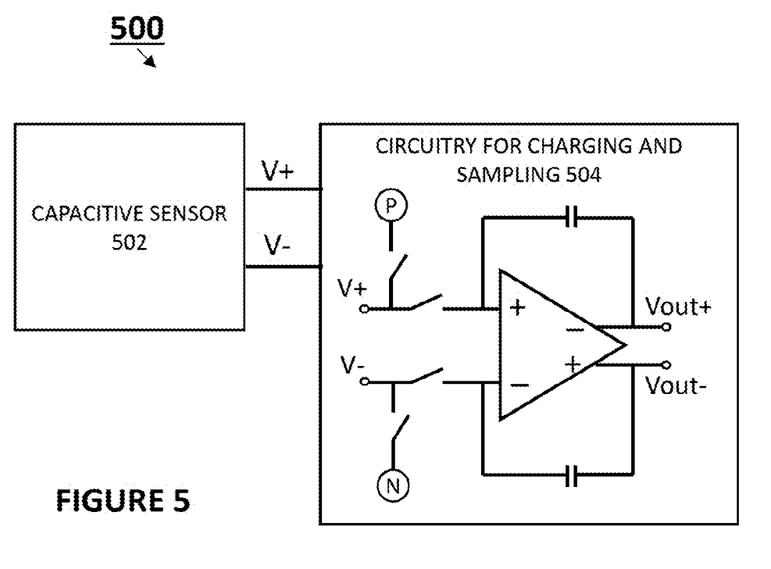
FIG. 5 shows a system having an improved capacitive sensor and circuitry for charging and sampling, according to some embodiments of the disclosure.

FIG. 5 shows a system having an improved capacitive sensor and circuitry for charging and sampling, according to some embodiments of the disclosure. The system 500 for sensing an environment of the capacitive sensor 502 using differential sampling includes the improved capacitive sensor according to any embodiment described herein. Furthermore, the system includes circuitry for charging and sampling 504. Specifically, the circuitry 504 can include two terminals (shown as V+ and V−) connected to the pair of traces of the improved capacitive sensor for differentially charging the capacitive sensor and sampling the capacitive sensor to obtain a differential measurement (two differential signals) representative of the environment.

In some embodiments, the circuitry 504 comprises a differential integrator for integrating the difference between the two differential signals V+ and V− present at the two terminals. Phrased differently, the differential integrator takes the two differential signals V+ and V− and generates an output (e.g., a differential output or a single-ended output) that is independent of the common mode voltage of the two differential signals V+ and V−. Although not necessary, the differential signals V+ and V− can be provided to a differential amplifier (not shown) for amplification before the differential integrator. The differential integrator can have a single ended output, or if suitable, the differential integrator can have differential outputs Vout+ and Vout− (as shown). The differential output(s) of the differential integrator can be provided to further circuitry for processing, e.g., to infer one or more characteristics of the environment of the capacitive sensor. The further processing can include activation of user interface element, gesture sensing, proximity sensing, environment or material sensing, etc. Due to differential signaling and the differential segmented shield, the output(s) of the differential integrator is not going to include substantial content contributed by noise that is coupled to the differential segmented shield (because the noise would be present as part of the common mode voltage present in the differential signals V+ and V−). Phrased differently, the circuitry 504 is preferably configured to reject noise coupled to the segmented differential shield portion.

To provide the charging phase and the sampling phase, the circuitry 504 can include switches configurable to connect the two terminals to a differential signal for charging the capacitive sensor, and switches configurable to connect the two terminals V+ and V− to the inputs of a differential integrator for amplifying and integrating the difference between the two differential signals present at the two terminals. Preferably, the switches that connect the two terminals V+ and V− enables simultaneous differential sampling, and not sequential sampling. Timing of the differential sampling is important for accurate measurement of the environment and for reduction of any phase errors between the two differential signals present at V+ and V−.

Figure 6:
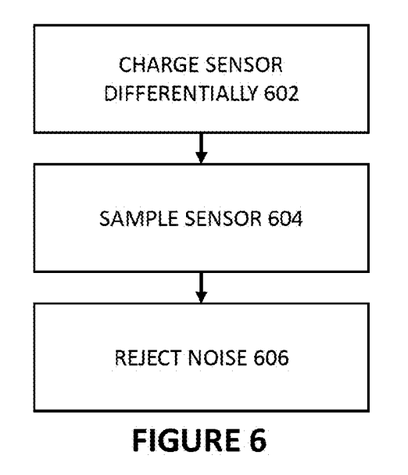
FIG. 6 is a flow diagram of an illustrative method sensing an environment of a capacitive sensor using differential sampling, according to some embodiments of the disclosure.

Exemplary Method for Sensing the Environment Using the Improved Capacitive Sensor FIG. 6 is a flow diagram of an illustrative method for sensing an environment of a capacitive sensor using differential sampling, according to some embodiments of the disclosure. The functions are generally performed by circuitry, such as circuitry illustrated in circuitry 504 of FIG. 5. The method includes differentially charging the capacitive sensor according to any embodiment described herein (box 602). Furthermore, the method includes sampling the capacitive sensor (e.g., via the traces' connection to the circuitry) to obtain a differential measurement (two differential signals) representative of the environment (box 604). Moreover, the method further comprises rejecting noise coupled to the segmented differential shield portion (box 606). The rejection of such noise is usually performed by differential signaling. In some embodiments, the method can include rejecting the common mode signal of the two differential signals generated by the capacitive sensor, since the noise coupled to the segmented differential shield portion (equally to the P and N segments) would generally be part of the common mode signal.

Further Variations and Implementations

It is noted that differential sampling with capacitive sensors can be based upon the technique described in U.S. Pat. No. 7,235,983, O'Dowd et al., entitled "ONE TERMINAL CAPACITOR INTERFACE CIRCUIT", which is hereby incorporated by reference in its entirety.

Note that the activities discussed above with reference to the FIGURES are applicable to any integrated circuits that involve signal processing, particularly those that can execute specialized software programs, or algorithms, some of which may be associated with processing digitized real-time data generated by the improved capacitive sensor. Certain embodiments can relate to multi-DSP signal processing, floating point processing, signal/control processing, fixed-function processing, microcontroller applications, etc. In certain contexts, the features discussed herein can be applicable to medical systems, scientific instrumentation, wireless and wired communications, radar, industrial process control, audio and video equipment, current sensing, capacitive sensing, instrumentation (which can be highly precise), and other systems involving capacitive sensing. In yet other example scenarios, the teachings of the present disclosure can be applicable in the industrial markets that include capacitive sensing systems that help drive productivity, energy efficiency, and reliability. In consumer applications, the teachings of the capacitive sensing discussed above can be used for image processing, auto focus, and image stabilization (e.g., for digital still cameras, camcorders, etc.). Other consumer applications can include audio and video processors for home theater systems, DVD recorders, and high-definition televisions. Yet other consumer applications can involve advanced touch screen controllers (e.g., for any type of portable media device). Hence, such technologies could readily part of smartphones, tablets, security systems, PCs, gaming technologies, virtual reality, simulation training, etc.

In the discussions of the embodiments above, electronic components and devices for providing the suitable circuitry (e.g., capacitors, clocks, DFFs, dividers, inductors, resistors, amplifiers, switches, digital core, transistors, and/or other components) can readily be replaced, substituted, or otherwise modified in order to accommodate particular circuitry needs. Moreover, it should be noted that the use of complementary electronic devices, hardware, software, etc. offer an equally viable option for implementing the teachings of the present disclosure.

In one example embodiment, any number of capacitive sensors and electrical circuits described herein may be implemented on a board of an associated electronic device. The board can be a general circuit board that can hold various components of the internal electronic system of the electronic device and, further, provide connectors for other peripherals and/or terminals for capacitive sensors. More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself.

In another example embodiment, the circuitry described herein may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the amplification functionalities may be implemented in one or more silicon cores in Application Specific Integrated Circuits (ASICs), Field Programmable Gate Arrays (FPGAs), and other semiconductor chips.

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

It is also important to note that the functions related to differential sampling shown in FIG. 6, illustrate only some of the possible functions that may be executed by, or within, systems illustrated in FIG. 5. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments. Numerous other changes, substitutions, variations, alterations, and modifications may be ascertained to one skilled in the art and it is intended that the present disclosure encompass all such changes, substitutions, variations, alterations, and modifications as falling within the scope of the appended claims. Note that all optional features of the apparatus described above may also be implemented with respect to the method or process described herein and specifics in the examples may be used anywhere in one or more embodiments.

Summary of Key Features

The present disclosure describes an improved capacitive sensor for sensing the environment using differential signaling. The capacitive sensor is arranged to provide a differential signal representative of the environment on the sensor.

The sensor comprises a single-ended portion, a segmented differential shield portion, and a pair of signal traces. The single-ended portion is on a first side of a circuit board or flex circuit (or any suitable insulating material/layer), and the segmented differential shield portion is on a second side of the circuit board or the flex circuit.

The single-ended portion is preferably smaller than the segmented differential shield portion (or that the segmented differential shield portion is preferably larger, i.e., spans a larger area, than the single ended portion), and is centered with respect to the segmented differential shield portion. The ratio of the sizes of the single-ended portion and the segmented differential shield portion may vary depending on the application.

The pair of traces carries the differential signal (having the notation "P signal" and "N signal"), and the traces carries the electrical signals from the single-ended portion and segmented differential shield portion to a processing circuit for processing.

The single-ended portion is adapted to sense the environment. The segmented differential shield portion is adapted to differentially balance the environment and reject noise coupling to the capacitive sensor.

The single ended portion may be connected to the trace carrying the P signal of the differential signal, or the trace carrying the N signal of the differential signal.

The single ended portion preferably has a circular shape, but other shapes are also envisioned (e.g., squares, ovals, triangles, rectangles, pentagons, hexagon, octagons, other suitable polygons, etc.).

The segmented differential shield portion comprises a plurality of segments, where a subset of the segments are connected to the trace carrying the P signal (referred to as the "P segments") of the differential signal and a subset of the segments are connected to the trace carrying the N signal of the differential signal (referred to as the "N segments").

The number of segments in the segmented differential shield portion may vary depending on the application and manufacturability.

The P segments are arranged in an alternating fashion with the N segments for a balancing effect. The segmented differential shield portion (and the arrangement of the P and N segments) may have a symmetric quality (rotational symmetry, reflectional symmetry, etc.).

The plurality of segments are preferably balanced in terms of the respective areas, i.e., the area of segments corresponding to the P signal is substantially the same as the area of the segments corresponding to the N signal. The number of segments corresponding to the P signal is the same as the number of segments corresponding to the N signal if the segments are equally sized for the P signal and the N signal. If the segments are not equally sized, then the number of segments corresponding to the P signal may not equal the number of segments corresponding to the N signal.

What is claimed is:

1. A capacitive sensor for sensing an environment of the capacitive sensor, wherein the capacitive sensor comprises:
   a single-ended portion;
   a segmented sensing differential shield portion having multiple segments; and
   a pair of traces coupled to two terminals of a differential sampling circuitry respectively for differential sampling;
   wherein the single-ended portion is connected to a first one of the traces, a first subset of the segments of the segmented sensing differential shield portion is connected to the first one of the traces, and a second subset of the segments is connected to a second one of the traces.

2. The capacitive sensor of claim 1, wherein:
   the first subset of the segments has the same area or charge contribution as the second subset of the segments.

3. The capacitive sensor of claim 1, wherein:
   the first subset of the segments are arranged in an alternating fashion with the second subset of the segments.

4. The capacitive sensor of claim 1, wherein:
   the single-ended portion is on a first side of an insulating layer; and
   the segmented sensing differential shield portion is on a second side of the insulating layer.

5. The capacitive sensor of claim 1, wherein:
   the single-ended portion is on a first side of an insulating layer; and
   the segmented sensing differential shield portion is on the first side of the insulating layer and on the second side of the insulating layer.

6. The capacitive sensor of claim 1, wherein the single-ended portion spans a smaller area than the segmented sensing differential shield portion.

7. The capacitive sensor of claim 1, wherein the single-ended portion is centered with respect to the segmented sensing differential shield portion.

8. The capacitive sensor of claim 1, wherein:
   the single-ended portion and the first subset of segments are driven by a first one of a pair of differential signals; and
   the second subset of the segments are driven by a second one of the pair of differential signals.

9. The capacitive sensor of claim 1, wherein the differential sampling circuitry substantially simultaneously samples a differential signal present on the pair of traces.

10. The capacitive sensor of claim 1, wherein:
    the single-ended portion is adapted to sense the environment; and
    the segmented sensing differential shield portion is adapted to differentially balance the environment and reject noise coupled to the segmented sensing differential shield portion.

11. The capacitive sensor of claim 1, wherein:
    the single ended portion has a circular shape; and
    the segmented sensing differential shield portion has a circular shape.

12. A system for sensing an environment of a capacitive sensor using differential sampling, the system comprising:
    the capacitive sensor comprising:
       a single-ended portion;
       a segmented sensing differential shield portion having multiple segments; and
       a pair of traces;
       wherein the single-ended portion is connected to a first one of the traces, a first subset of the segments of the segmented sensing differential shield portion is connected to the first one of the traces, and a second subset of the segments is connected to a second one of the traces, and
    a circuitry having two terminals connected to the pair of traces for differentially charging the capacitive sensor and substantially simultaneous sampling the capacitive sensor to obtain two differential measurement signals representative of the environment.

13. The system of claim 12, wherein:
    the circuitry comprises a differential integrator for integrating the difference between the two differential signals present at the two terminals.

14. The system of claim 12, wherein:
    the circuitry rejects noise coupled to the segmented sensing differential shield portion.

15. The system of claim 12, wherein the circuitry comprises:
    switches configurable to connect the two terminals to a differential signal for charging the capacitive sensor; and
    switches configurable to connect the two terminals to the inputs of a differential integrator for amplifying the difference between the two differential signals present at the two terminals.

16. The system of claim 12, further comprising:
    an insulating layer;
    wherein the single-ended portion is on a first side of an insulating layer and the segmented sensing differential shield portion is on at least a second side of the insulating layer.

17. The system of claim 16, wherein the insulating layer comprises a circuit board, flexible plastic substrate of a flexible circuit, and/or electrically insulating material.

18. A method for sensing an environment of a capacitive sensor using differential sampling, the method comprising:
differentially charging the capacitive sensor by connecting a first terminal and a second terminal to a first one of a differential signal and a second one of the differential signal respectively, wherein the first terminal and the second terminal are connected to a first trace and a second trace respectively, the first trace is connected to a single ended portion of the capacitive sensor and a first subset of segments of a segmented sensing differential shield portion of the capacitive sensor, and the second trace is connected to a second subset of segments of the segmented sensing differential shield portion of the capacitive sensor; and
substantially simultaneously sampling two differential measurement signals present at the first terminal and the second terminal.

19. The method of claim 18, further comprising:
rejecting noise and parasitic capacitances coupled to the segmented sensing differential shield portion through differential signaling.

20. The method of claim 18, further comprising:
rejecting a common mode signal of the two differential signals generated by the capacitive sensor.

\* \* \* \* \*